United States Patent [19]

Iwata et al.

[11] Patent Number: 5,084,751
[45] Date of Patent: Jan. 28, 1992

[54] BIPOLAR TRANSISTOR

[75] Inventors: Hitoshi Iwata; Yasuo Imaeda; Koichi Jinkai; Kenichi Kinoshita, all of Aichi, Japan

[73] Assignee: Kabushiki Kaisha Tokai Rika Denki Seisakusho, Aichi, Japan

[21] Appl. No.: 708,844

[22] Filed: May 30, 1991

Related U.S. Application Data

[63] Continuation of Ser. No. 515,442, Apr. 27, 1990, abandoned.

[30] Foreign Application Priority Data

Apr. 28, 1989 [JP] Japan ................................ 1-110435

[51] Int. Cl.⁵ ...................... H01L 29/72; H01L 23/48
[52] U.S. Cl. ......................................... 357/36; 357/34; 357/68
[58] Field of Search ............................ 357/34, 36, 68

[56] References Cited

U.S. PATENT DOCUMENTS

| 3,461,357 | 8/1969 | Mutter et al. | 357/36 |
| 3,567,506 | 3/1971 | Belarde | 357/36 |
| 4,161,740 | 7/1979 | Frey | 357/36 |

FOREIGN PATENT DOCUMENTS 62-29123  2/1986  Japan ................................ 357/36

Primary Examiner—J. Carroll
Attorney, Agent, or Firm—Finnegan, Henderson, Farabow, Garret, and Dunner

[57] ABSTRACT

A bipolar transistor of a multi-emitter construction comprises a base diffusion layer formed in a substrate, a number of emitter diffusion layers formed in the base diffusion layer and arranged in a two-dimensional pattern, a base electrode film formed on the base diffusion layer, the base electrode film having a branch connection portion of a mesh-like shape surrounding each group consisting of at least one of the emitter diffusion layers, the base electrode film also having a main connection portion connected to said branch connection portion, and emitter electrode films formed respectively on said emitter electrode layers.

8 Claims, 3 Drawing Sheets

BIPOLAR TRANSISTOR

This application is a continuation of application Ser. No. 07/575,442 filed Apr. 27, 1990 abandoned.

BACKGROUND OF THE INVENTION

This invention relates to an improved bipolar transistor of a multi-emitter construction.

In conventional transistors of the type described, many emitter diffusion layers are formed in a base diffusion layer, and an emitter electrode is formed on each emitter diffusion layer. Such transistor is equivalent to a structure in which many transistors are arranged in parallel. With this construction, a uniform base current can be supplied to the surface of each emitter diffusion layer, and therefore the effective area of the emitter as a whole can be close to the geometric area. This achieves an increased maximum operating current of the transistor.

However, in such a conventional transistor, when the base current increases, a voltage drop due to the resistance of a base electrode film occurs during the time when the base current flows through the base electrode film. Therefore, the magnitude of the base current can not be maintained uniform between the emitter diffusion layer disposed close to the base current supply source and the emitter diffusion layer disposed remote from this supply source. More specifically, when the base current is thus rendered non-uniform, the maximum operating current of the transistor is limited to a magnitude or level determined by the emitter diffusion layer subjected to a large base current (that is, having a large emitter current) among the emitter diffusion layers. This results in a problem that the maximum operating current of the transistor is smaller than the sum of the maximum operating currents of the emitter diffusion layers.

Under the above circumstances, for example, in the case where a specified one out of the emitter diffusion layers is used as a transistor for detecting the total emitter current, the relation of proportion between the detection current detected by such detection transistor and the total emitter current becomes improper when a large current flows, which results in a problem that the detection of the total emitter current can not be accurately carried out, as shown in FIG. 4(b).

SUMMARY OF THE INVENTION

It is an object of this invention to solve the foregoing problem and to provide a bipolar transistor of a multi-emitter construction which can supply a uniform base current to a number of emitter diffusion layers so as to uniformly operate all the emitter diffusion layers, thereby increasing the maximum operating current.

According to the present invention, there is provided a bipolar transistor of a multi-emitter construction comprises:

a base diffusion layer formed in a substrate;

a number of emitter diffusion layers formed in said base diffusion layer and arranged in a two-dimensional pattern;

a base electrode film formed on said base diffusion layer, said base electrode film having a branch connection portion of a mesh-like shape surrounding each group consisting of at least one of said emitter diffusion layers, said base electrode film also having a main connection portion connected to said branch connection portion; and emitter electrode films formed respectively on said emitter electrode layers;

a cross-sectional area of said main connection portion of said base electrode film which determines a resistivity thereof being greater than that of said branch connection portion.

In the bipolar transistor of the invention, a base current is supplied to the base diffusion layer via the main connection portion and branch connection portion of the base electrode film. At this time, since the cross-sectional area of the main connection portion which determines the resistivity thereof is greater than that of the branch connection portion, a voltage drop due to the flowing of the base current is reduced, and therefore a uniform base current can be applied generally over the entire surface. As a result, a generally uniform emitter current flows through the emitter diffusion layers, and therefore the emitter diffusion layers can operate in the same manner (that is, not differently from one another), and the maximum operating current as a whole can be increased. Further, since the emitter currents flowing respectively through the emitter diffusion layers are rendered uniform, the total emitter current is increased in proportion to the number of the emitter diffusion layers.

DESCRIPTION OF THE PREFERRED EMBODIMENTS OF THE INVENTION

One example of bipolar transistor with an operating current-detecting terminal according to the present invention will now be described with reference to the drawings.

Figure 1:
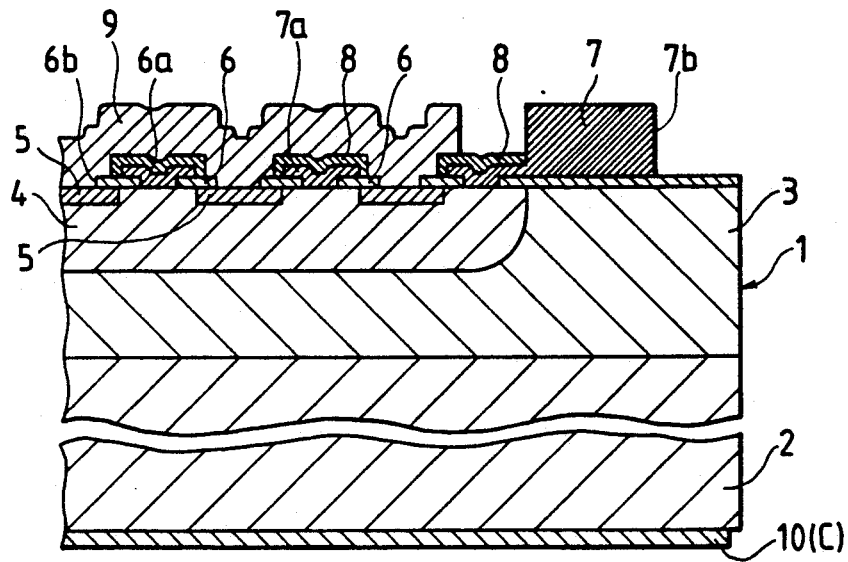
FIG. 1 is a cross-sectional view of a portion of a chip provided in accordance with the present invention.
Figure 2:
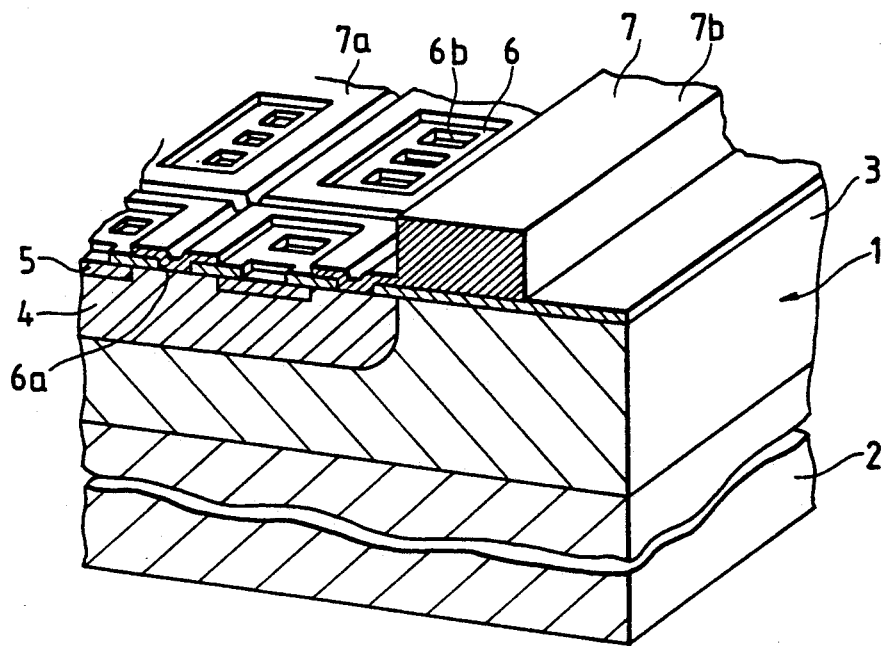
FIG. 2 is a perspective view of the chip of FIG. 1, with an emitter electrode film and a layer-insulation film omitted.

FIG. 1 shows the cross-section of a chip 1 constituting a transistor of a multi-emitter construction. A substrate 2 is made, for example, of an n-type silicon. An n-type epitaxial layer 3 is formed in the upper portion of the substrate 2, the concentration of impurities in the epitaxial layer 3 being lower than that of the substrate 2. A base diffusion layer 4 of a rectangular shape is formed in the epitaxial layer 3. A number of emitter diffusion layers 5 are formed and arranged in the base diffusion layer 4 in a two-dimensional manner or pattern, and are divided into a plurality of groups each consisting of, for example, three emitter diffusion layers 5, as shown in FIG. 2. In this case, each emitter diffusion layer 5 constitutes a transistor cell p, and a specified one out of these cells is used as a current-detecting transistor d as later described. The base diffusion layer 4 and the emitter diffusion layers 5 are formed by a known planar process in which donor and acceptor impurities are applied to the substrate, for example, by thermal diffusion. A silicon oxide film 6 is formed on the surface of the chip 1 after the diffusion. Contact holes 6a and 6b for base and emitter electrodes are formed in the silicon oxide film 6.

Figure 3:
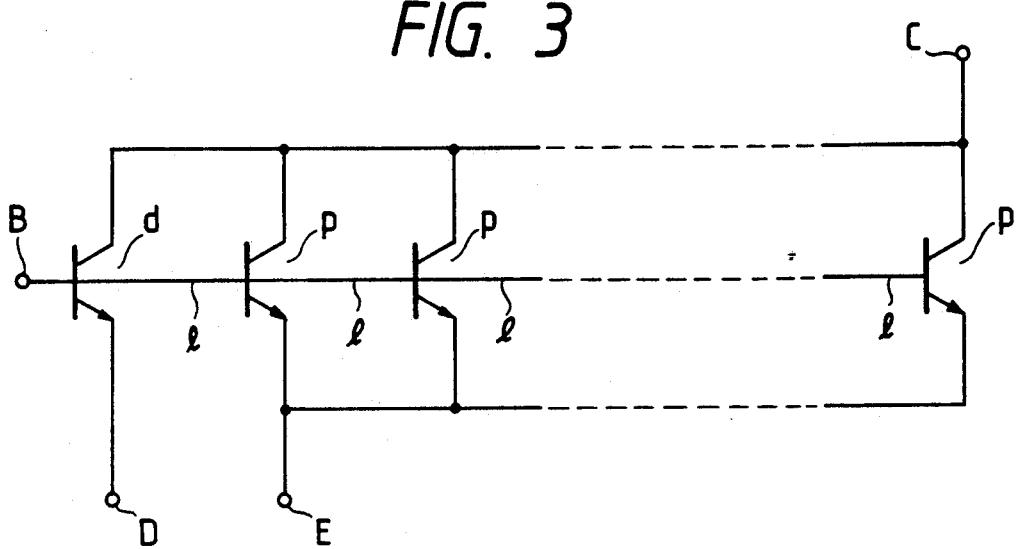
FIG. 3 is an electrically-equivalent circuit diagram.
Figure 4A:
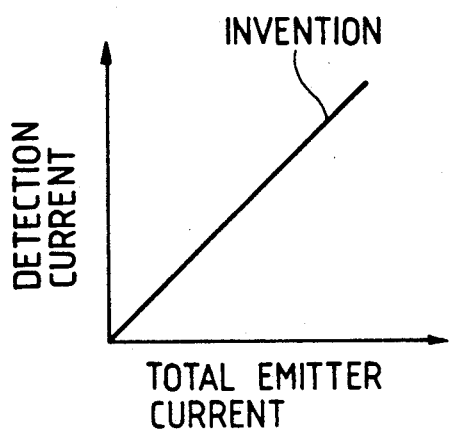
FIGS. 4(a) and 4(b) are illustration showing the relation between a detecting current of a current detecting transistor and a total emitter current.
Figure 4B:
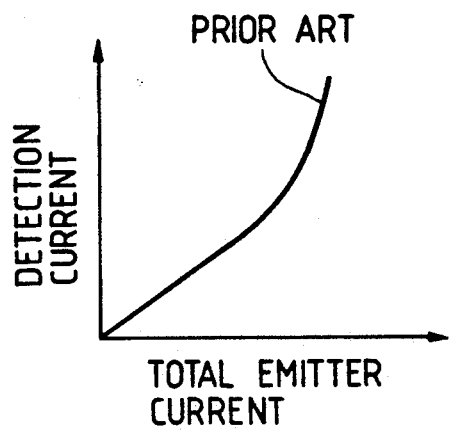

A base electrode film 7 constitutes a base electrode B (see FIG. 3). The base electrode film 7 has a branch connection portion 7a coated on the upper surface of the base diffusion layer 4 through the contact holes 6a of the silicon oxide film 6, and a main connection portion 7b connected to the branch connection portion 7a. In the base electrode film 7, the branch connection portion 7a is of a mesh-like shape and is disposed above the base diffusion layer 4 in surrounding relation to each group consisting of at least one of emitter diffusion layers 5 (see FIG. 2). The main connection portion 7b is disposed on that portion of the silicon oxide film 6 disposed adjacent to the outer peripheral portion of the base diffusion layer 4, the main connecting portion 7b being disposed in surrounding relation to the branch connection portion 7a. The main connecting portion 7b is connected at a plurality of portions to the branch connection portion 7a. The main connection portion 7b is greater in thickness and width than the branch connection portion 7a, and in other words the main connection portion 7b has a greater cross-sectional area than that of the branch connection portion 7a. With this construction, the resistivity of the main connection portion 7b is rendered to such a small level that a voltage drop due to the base current is negligible. A layer-insulation film 8 covers the branch connection portion 7a of the base electrode film 7, and has openings at those portions thereof disposed respectively in registry with the contact holes 6b corresponding respectively to the emitter diffusion layers 5. An emitter electrode film 9 constitutes an emitter electrode E (see FIG. 3), and is formed on the layer-insulation film 8 to be coated onto the emitter diffusion layer 5 through the opening of the layer-insulation film 8 and the contact hole 6b. In this case, the emitter electrode film 9 is not coated onto that emitter diffusion layer 5a corresponding to the current-detecting transistor d, and a detection terminal electrode (not shown) is coated onto this emitter diffusion layer 5a, and a current-detecting terminal D is adapted to connected to this detection terminal electrode (see FIG. 3). The base electrode film 7 and the emitter electrode film 9 are formed by vapor deposition of metal of a high electrical conductivity, such as aluminum. A collector electrode film 10 constituting a collector electrode C (see FIG. 3) is formed on the lower surface of the substrate 2.

FIG. 3 shows an equivalent circuit diagram representative of an electrical construction of the above transistor in which the transistor cells p having emitters constituted respectively by the emitter diffusion layers 5 are connected in parallel. Only the current-detecting transistor d has a different emitter terminal serving as the current-detecting terminal D. In this case, base terminals b of the transistor cells p are connected to one another by the branch connection portion 7a and main connection portion 7b of the base electrode film 7 as described above. Therefore, the resistivity is of a small value that can be neglected.

Figure 5:
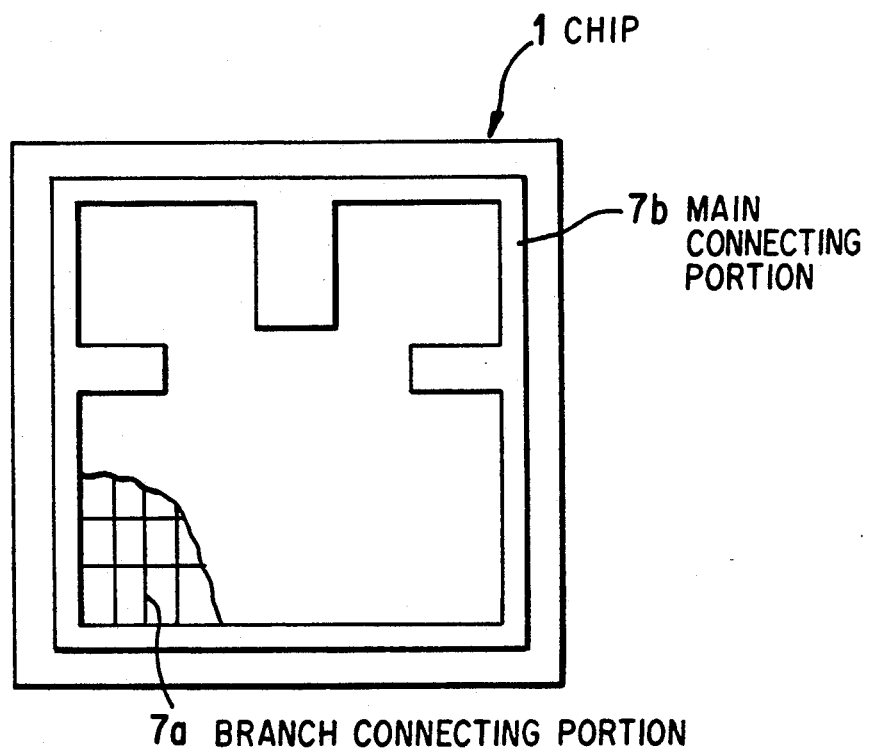
FIG. 5 illustrates a main connection portion which surrounds a branch connection portion.

With the above construction, the base current flows into the emitter diffusion layers via the main connection portion 7b of the base electrode film 7, the mesh-like branch connection portion 7a and the base diffusion layer 4. At this time, since the main connection portion 7b is small in resistivity in the direction of the current, the base currents applied to the transistor cells p are of substantially the same magnitude, and therefore the emitter currents flowing through the transistor cells p are not different from one another. As a result, unlike the prior art, an increased maximum operating current can be achieved. Further, since the emitter currents flowing into the transistor cells p are uniform, the relation of proportion between the emitter current flowing through the current-detecting transistor d and the total emitter current is properly maintained. This enables an accurate detection of the total emitter current. FIG. 5 illustrates a chip 1 having thereon a main connection portion 7b which surrounds a branch connection portion 7a.

In the above embodiment, although the invention has been described with respect to the bipolar transistor with a current-detecting terminal, this invention is not limited to such type of transistor and can be applied to other bipolar transistors of a multi-emitter construction.

As described above, in the bipolar transistor according to the present invention, the base electrode film has the branch connection portion of a mesh-like shape surrounding each group consisting of at least one of the emitter diffusion layers, and the main connection portion connected to the branch connection portion. With this construction, the base current flowing from the base electrode film into the emitter diffusion layers will not cause a voltage drop at the main connection portion, and therefore is uniform. Therefore, the total emitter current can be uniformly supplied to all the emitter diffusion layers, and an increased maximum operating current can be achieved.

What is claimed is:

1. A bipolar transistor of a multi-emitter construction comprising:

a base diffusion layer formed in a substrate;

a number of emitter diffusion layers formed in said base diffusion layer and arranged in a two-dimensional pattern;

a base electrode film formed on said base diffusion layer, said base electrode film having a branch connection portion of a mesh-like shape surrounding each group consisting of a plurality of said emitter diffusion layers, said base electrode film also having a main connection portion connected to said branch connection portion; and emitter electrode films formed respectively on said emitter diffusion layers.

2. A bipolar transistor as claimed in claim 1, wherein a cross-sectional area of said main connection portion of said base electrode film which determines a resistivity thereof is greater than that of said branch connection portion.

3. The bipolar transistor of claim 2, wherein said base electrode film permits a substantially uniform current to flow through each said branch connection portion.

4. The bipolar transistor of claim 1, wherein said branch connection portion is substantially covered with an insulation film.

5. The bipolar transistor of claim 1, wherein said main connection portion surrounds said branch connection portion.

6. The bipolar transistor of claim 1, wherein said main connection portion is connected at a plurality of locations to said branch connection portion.

7. The bipolar transistor of claim 1, wherein said base electrode film comprises aluminum.

8. The bipolar transistor of claim 1, wherein said base electrode film consists essentially of aluminum.

* * * * *